United States Patent [19]

Noguchi et al.

[11] 4,433,311
[45] Feb. 21, 1984

[54] DELTA MODULATION SYSTEM HAVING REDUCED QUANTIZATION NOISE

[75] Inventors: Toyota Noguchi, Kyoto; Mamoru Kaneko, Neyagawa; Hironori Katoh, Hirakata, all of Japan

[73] Assignee: Matsushita Electric Industrial Co., Ltd., Osaka, Japan

[21] Appl. No.: 244,646

[22] Filed: Mar. 17, 1981

[30] Foreign Application Priority Data

Mar. 19, 1980 [JP] Japan .................................. 55-35316

[51] Int. Cl.³ .......................................... H03K 13/22
[52] U.S. Cl. ................................... 332/11 D; 375/28
[58] Field of Search ................... 332/11 D; 375/27–32

[56] References Cited

U.S. PATENT DOCUMENTS

| 3,716,803 | 12/1971 | Candy | 332/11 D |
| 3,878,465 | 4/1975 | Stephenne et al. | 375/30 |
| 3,879,663 | 4/1975 | McGrogan, Jr. | 332/11 D X |

*Primary Examiner*—Siegfried H. Grimm
*Attorney, Agent, or Firm*—Wenderoth, Lind & Ponack

[57] ABSTRACT

A delta modulation system which has a reduced quantization noise level. The system compares its input signal with an integrated and filtered version thereof and inhibits the integration when the difference therebetween has not varied for two or more consecutive clock periods.

3 Claims, 6 Drawing Figures

DELTA MODULATION SYSTEM HAVING REDUCED QUANTIZATION NOISE

BACKGROUND OF THE INVENTION

This invention relates to an improvement in delta modulation techniques. An object of the invention is to reduce accompanying quantization noises by this technique.

Generally, delta modulation methods include a linear type delta modulation method and an adaptive type delta modulation method. FIG. 1 shows the adaptive type delta modulation method and FIG. 2 shows the signal waveforms of an input signal, output signal and modulation signal of such a method. For a quick understanding of this method, the integration step size, i.e., a variable value by one step of integration, for the following description of the invention, is assumed to be constant, but the integration step size is of course moderately affected by the adapted delta modulation method. The integration step size is determined on the basis of the compression or expansion characteristic by the slope and/or amplitude of an input signal. Since the delta modulation method at the receiving side provides a local demodulator which is the same as that provided at the sending side, an output waveform of the local demodulator, in this description, is substituted for a demodulation waveform obtained at the receiving side.

Referring to FIG. 1, element 1 is an analog comparator; element 2 is a holding circuit (usually a D flip-flop), element 3 is a syllabic filter and integrator; terminal 4 is an analog signal input; terminal 5 is a clock input where the clock determines the hold-timing of the holding circuit 2; terminal 6 is the output of the holding circuit 2, and is a digital signal output of the delta modulator; and line 7 is the output of the syllabic filter and integrator 3, i.e., the output of local demodulator 8. The delta modulator is so looped that the output of the integrator 3 tracks an analog input signal provided at input 4 and coresponding to the clock timing, whereby the output 7 of integrator 3 becomes the analog output of the receiver. A digital output becomes the transmitted signal and the local demodulator 8 itself is used at the receiving side.

The analog signal $e_{in}$, when fed to the analog comparator 1 via input 4, is compared with the output $e_{out}$ of the local demodulator 8; at which time, if $e_{in} > e_{out}$, then the output of the analog comparator 1 becomes V (H), and if $e_{out} > e_{in}$, then it becomes V (L). The output of comparator 1 is the input of the holding circuit 2, and is held by the clock from clock input 5 and integrated so as to be fed to the ⊖ input of the comparator 1. Hence, $e_{out}$ tends to approach $e_{in}$ at every clock.

The syllabic filter serves to change the integration stepsize of the signal provided to the integrator 3 in order to provide the compression and expansion characteristic in dependence upon the slope and amplitude of input signal, thereby preventing slope overloading. Slope overloading refers to the condition that the demodulation waveform departs considerably from the input signal, because an amount applied to the integrator 3 cannot reach the input signal.

A signal from the digital signal output 6 of the delta modulator passes through a transmission line to reach the input of the receiver (i.e.—the input of the holding circuit 2). Since the holding circuit 2 holds the input signal in response to clock signal 5, the output of syllabic filter and integrator 3 becomes equal to that of the input signal except for being delayed by one clock.

FIG. 2 shows each signal waveform of the delta modulator, in which a is a waveform of the analog input signal, b is that of the clock signal for the holding circuit, c is that of the digital output of the delta modulator, and d is an output signal from the local demodulator, and also represents the demodulated waveform at the receiving side, which, if necessary, is subsequently passed through a low-pass filter.

The waveform at each unit of the conventional delta modulator is shown in FIG. 2, in which no slope overloading is generated. In other words, the adaptive type delta modulator is constructed to eliminate the slope overloading, whereby both the linear type delta modulator and the adaptive type delta modulator are equally effective in generating no slope overloading.

The speed of changing a time constant of the syllabic filter at the adaptive delta modulator, and in turn, a step size of integration, largely contributes to the characteristic response of the circuit. When a large time constant is used, the step size is smaller than needed and the system response becomes poor. On the other hand, when a small time constant is used, the system response is improved, but the step size is larger than needed.

As seen from FIG. 2, the waveform d tracks the input waveform a corresponding to the timing of clock b. In other words, the digital output c is integrated, so that a is integrated in plus when the digital output c is H and in minus when it is L. Waveform e of FIG. 2 shows the difference between the analog input waveform a and the demodulation output d.

Quantization noise which is the difference signal e, is incidentially generated in the delta modulation.

SUMMARY OF THE INVENTION

This invention is aimed at a reduction of the quantization noise. The reduction of the quantization noise is achieved according to this invention by providing a delta modulation system having: an analog comparator which compares an input analog signal with an output signal of an integrator, a holding circuit for holding the output of said analog comparator in response to a clock signal, a pattern recognition circuit (coincidence circuit) which continuously stores a condition of said holding circuit and judges the contents thereof, and an integration stoppage circuit for keeping the contents of said integrator from changing by use of the output of said pattern recognition circuit, characterized in that when said holding circuit continuously holds the output of said analog comparator, after at least two or more consecutive values have been kept unchanged by said integration stoppage circuit, said integrator is adapted to stop integration until the next clock.

BRIEF DESCRIPTION OF THE DRAWINGS

Next, an embodiment of the invention will be detailed in accordance with the accompanying drawings, in which.

DESCRIPTION OF THE PREFERRED EMBODIMENT

Figure 3:
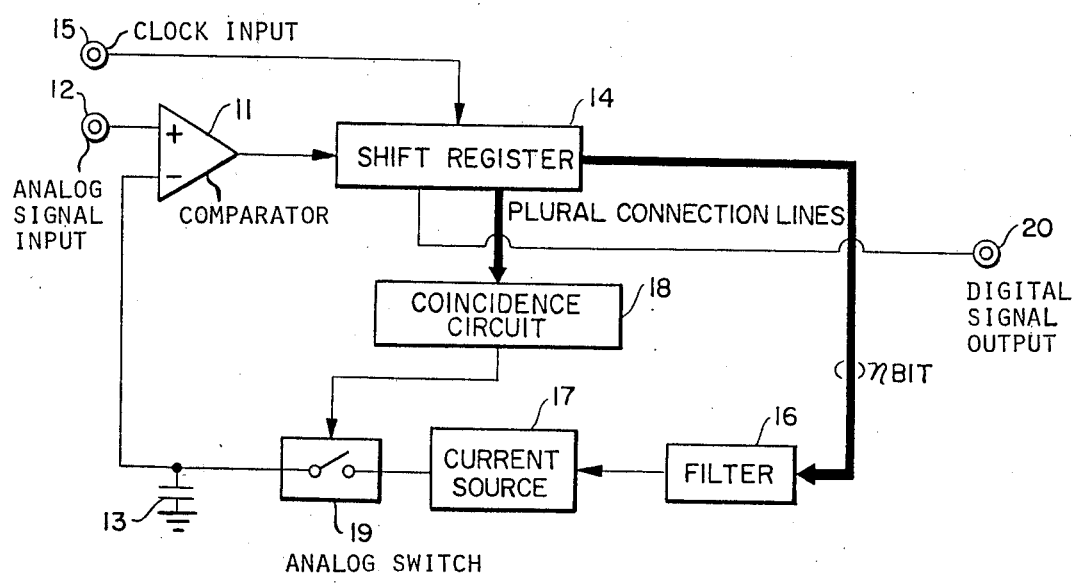
FIG. 3 is a block diagram of an embodiment of a delta modulation system of the present invention.

FIG. 3 shows an embodiment of the delta modulation system of the present invention. Analog comparator 11 compares an analog signal from analog input 12 with the voltage across integration capacitor 13; the output of comparator 11 is connected to the input of a n bit shift register 14, the shift register 14 being shifted in response to a clock input 15. The contents of the shift register 14 change the contents of the syllabic filter 16, thereby determining the integration step size. The syllabic filter 16 drives a current source 17. The amount of charge (within one clock period) which is stored in integration capacitor 13 is defined. A coincidence circuit 18 controls an analog switch 19 in response to the contents of shift register 14. In other words, when shift register 14 changes after sequentially shifting constant values, i.e.—when the shift register outputs the sequence H . . . HL or outputs the sequence L . . . LH, then after the sequence H . . . H or L . . . L coincidence circuit 18 turns off analog switch 19, thereby inhibiting the changing of the contents of integration capacitor 13. The digital output 20 is connected to the output of the first bit of the shift register 14.

Figure 1:
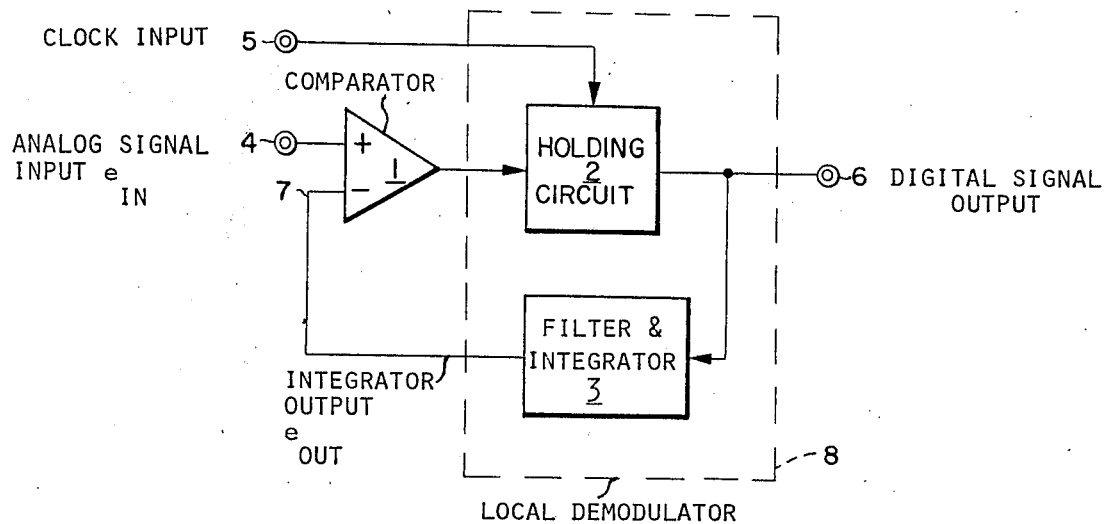
FIG. 1 is a block diagram of a conventional delta modulation system.
Figure 2:
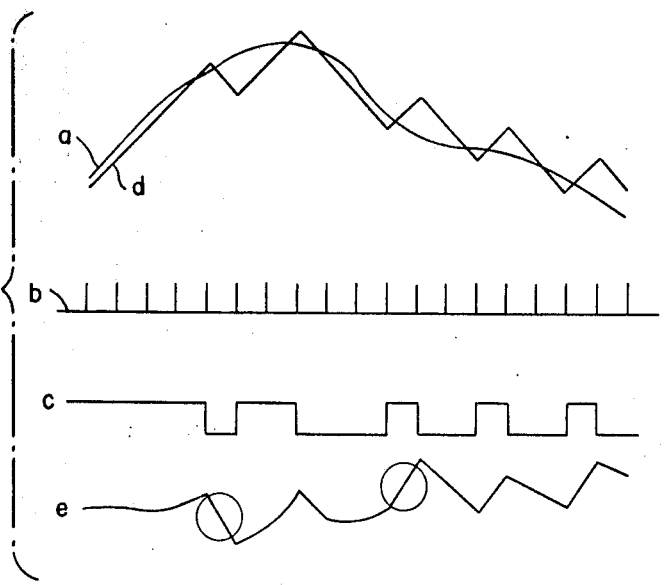
FIG. 2 shows signal waveforms at the respective units of the conventional system.

FIG. 3 shows an effective system for reducing the quantization noise which is generated in the delta modulation method. It is sufficiently effective to reduce the quantization noise so as to achieve a level-lowering of difference signal e. In other words, the spectrum distribution of energy of difference signal e is often approximately constant regardless of the frequency, and often referred to as the granular noise. Hence, the moment of enlarging the level of difference signal e is noticed herewith, thereby targeting a lowering of the difference signal. It can be seen that difference signal e becomes larger at the time point of low level digital values after continued high level digital values and of high level digital values after continued low level digital values at the digital output c, which points are marked by circles in FIG. 2.

Hence, the integration is designed to be changed in order to lower the level of the difference signal e, so that no integration is carried out when the digital output signal is respectively a high level or a low level after two or more consecutive low levels or high levels.

Figure 4:
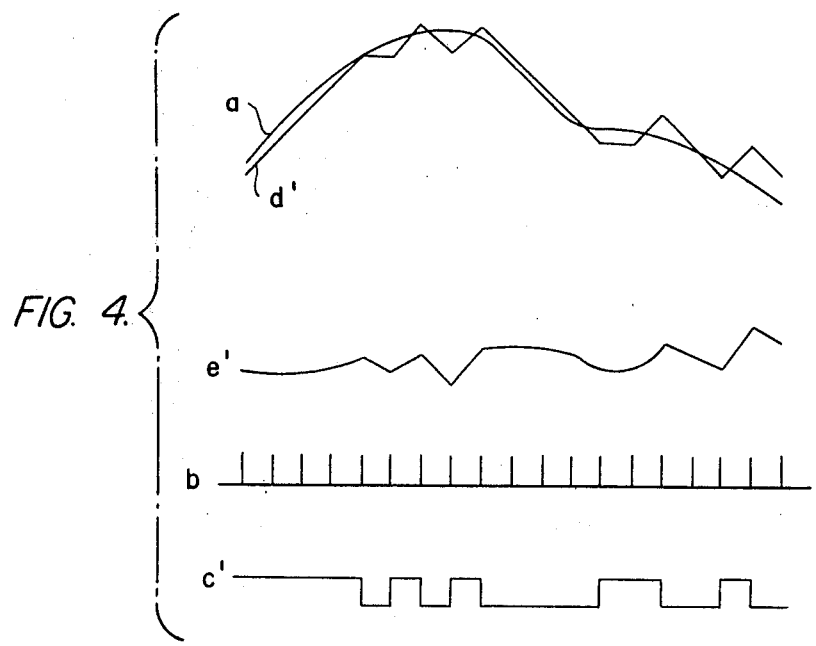
FIG. 4 shows signal waveforms at the respective units of the system of the present invention.

FIG. 4 shows difference signal e' between the local demodulator output d' and the input waveform a. As seen from comparison of the difference signal e in FIG. 2 with the difference signal in FIG. 4, by means of said integration technique, the difference signal e' has a lowered level. In brief, the quantization noise is reduced. Clock b in FIG. 4 is similar to that in FIG. 2. Digital output c' is different from that in FIG. 2 due to the changed integration technique. Thus, even in comparison of similar step sizes, a difference between e and e' is large, so that a reduction of the quantization noise results.

In order to prove the usefulness of this method, a simultation by a computer has been carried out to compute the signal to noise ratio with respect to various input waveforms. As a result, a lowering of the average noise level of about 5 dB has been calculated.

Figure 5:
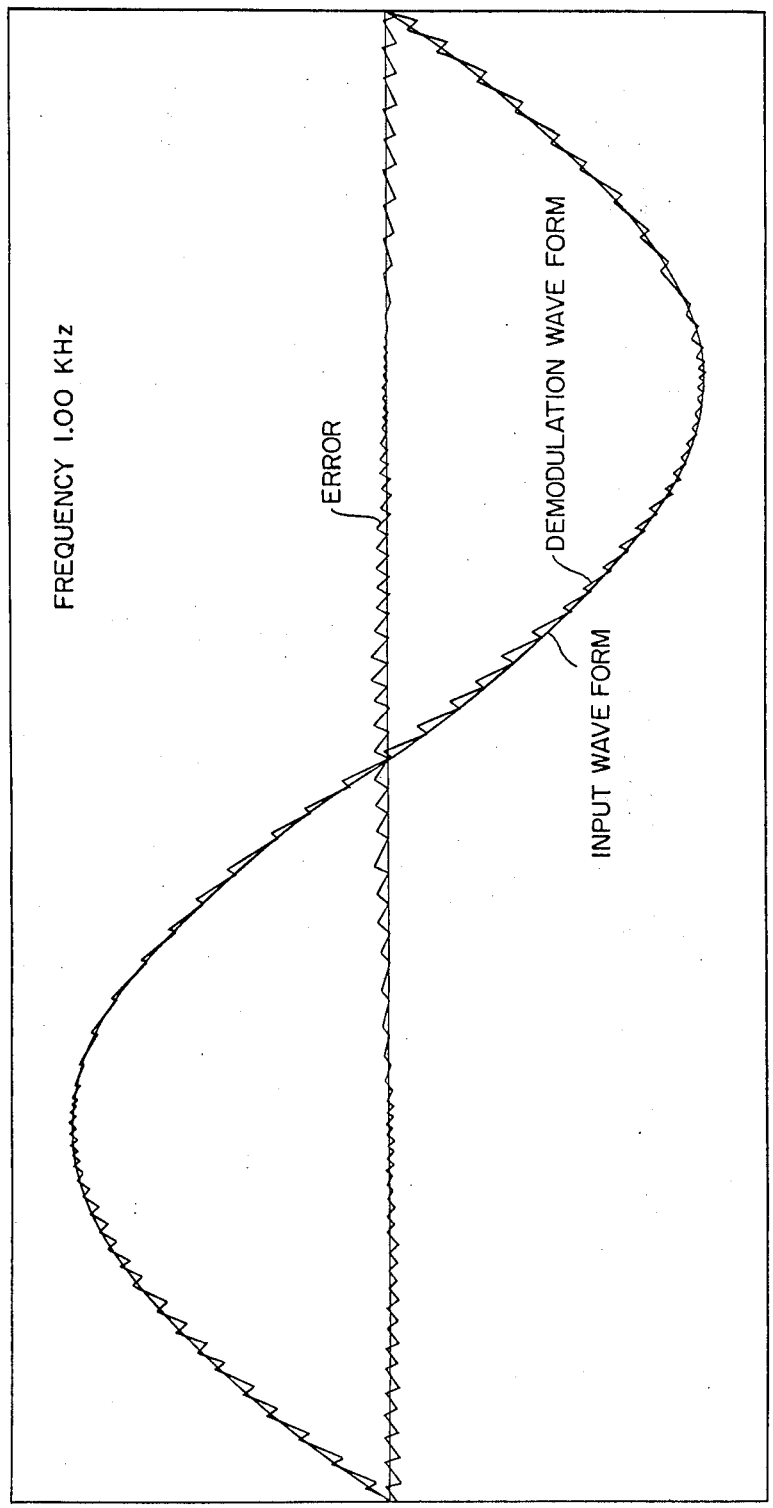
FIG. 5 is a view of a waveform in accordance with the conventional system.
Figure 6:
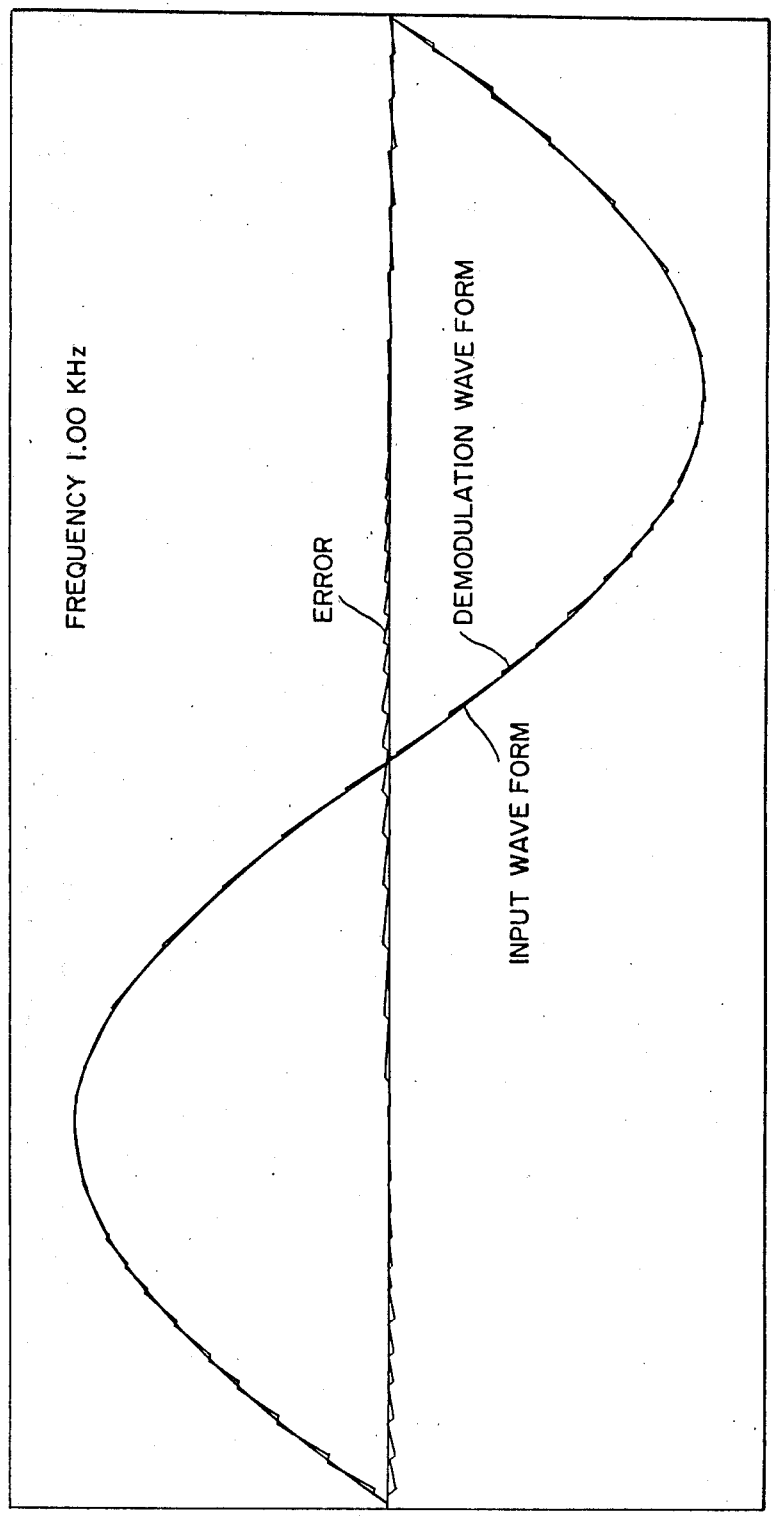
FIG. 6 is a view of a waveform in accordance with the system of the invention.

Its typical examples are shown in FIGS. 5 and 6, FIG. 5 showing a delta integration waveform by the conventional method, and FIG. 6 showing the method of the present invention.

As seen from the above, this invention can keep the integration step size in the proper value corresponding to the difference signal between the input waveform and the demodulation output waveform, and, as a result thereof, the quantization noise is considerably reduced.

What is claimed is:

1. A delta modulation system comprising:
    an analog comparator for comparing an input analog signal with an output signal of an integrator;
    a shift register connected to an output of said analog comparator for storing an output signal of said comparator, said shift register being shifted by a clock pulse signal having a predetermined clock pulse period;
    a syllabic filter means connected to an output of said shift register for determining a step size of an integration of said integrator in accordance with a parallel output signal of said shift register, said integrator integrating an output signal of said syllabic filter means;
    an integration stoppage circuit disposed between said syllabic filter means and said integrator for stopping said integration of said integrator; and
    a pattern recognition circuit connected to said integration stoppage circuit for controlling said integration stoppage circuit in accordance with at least a part of said parallel output signal of said shift register;
    wherein said pattern recognition circuit enables said integration stoppage circuit to stop said integration when said output signal of said comparator changes its signal level after at least two consecutive clock pulse periods of outputting an unchanged output signal.

2. A system according to claim 1, wherein said integration stoppage circuit comprises an analog switch and wherein said integrator and said syllabic filter means are connected together via said analog switch and a current source.

3. A system according to claim 2, wherein said integrator comprises a capacitor.

* * * * *